Figure 1:
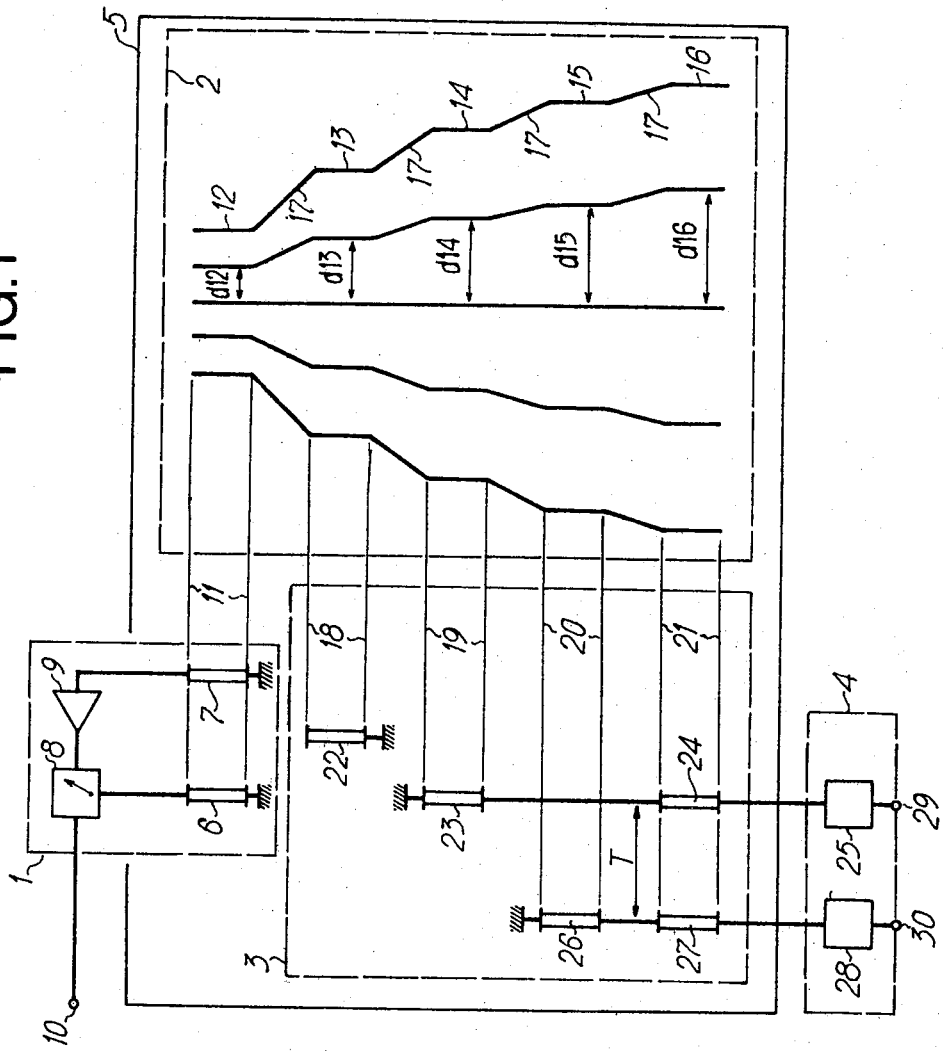

United States Patent [19]

Feldmann et al.

[11] 4,225,855

[45] Sep. 30, 1980

[54] ANALOG-DIGITAL CONVERSION DEVICE WITH SURFACE ELASTIC WAVES

[76] Inventors: Michel Feldmann, 45, rue Saint Lambert, 75015 Paris; Jeannine Le Goff épouse Hénaff, 3ter, Place Marquis, 92140 Clamart, both of France

[21] Appl. No.: 948,251

[22] Filed: Oct. 3, 1978

[30] Foreign Application Priority Data

Oct. 6, 1977 [FR] France ............................... 77 30634

[51] Int. Cl.$^2$ ........................................... H03K 13/02
[52] U.S. Cl. .......................... 340/347 AD; 307/233 R; 328/140; 333/193; 340/347 M
[58] Field of Search ................... 340/347 M, 347 AD; 307/233 R; 328/140; 333/153, 151, 193–195

[56] References Cited

U.S. PATENT DOCUMENTS

| | | | |
|---|---|---|---|
| 3,613,067 | 10/1971 | Haberle | 340/347 AD |
| 4,079,342 | 3/1978 | Solie | 333/195 X |

OTHER PUBLICATIONS

Feldmann et al., A Frequency Sensitive Device for Filter and Channel Bank, Centre National d'Etudes des Telecommunications, France.

Feldmann et al., A New Multistrip Acoustic Surface Wave Filter, 11/1974, IEEE Ultrasonics Symposium, Milwaukee, Wis.

Feldmann et al., An ASW-Filter Using Two Fan--Shaped Multistrip Arrays, 1976 Ultrasonic Symposium Proceedings, IEEE #76 CH1120-5SU.

*Primary Examiner*—Thomas J. Sloyan
*Attorney, Agent, or Firm*—Laff, Whitesel & Rockman

[57] ABSTRACT

The surface elastic wave device is an integral part of an analog-digital converter with intermediate frequency conversion. It is comprised of the acoustical part of a 4-pole surface elastic wave oscillator, a surface elastic wave reflector with track shifting working as a filter assembly and comprising one supply track and several return tracks having different angular frequencies, the reflector operating as a plurality of filters, and output transducers overlapping the return tracks and connected to detectors producing the digital information. Many types of reflectors and output transducer assemblies are described. The invention is useful with analog-digital converters having medium access times.

9 Claims, 4 Drawing Figures

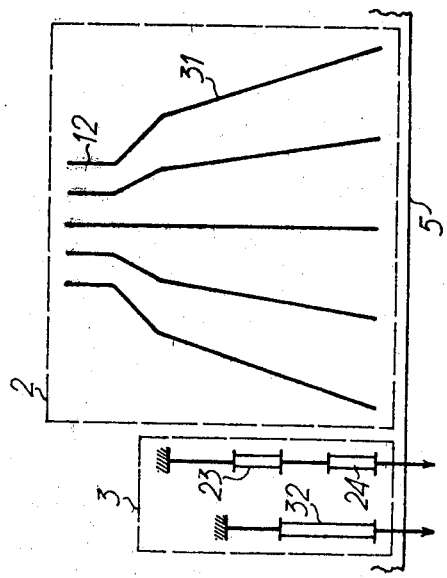

ANALOG-DIGITAL CONVERSION DEVICE WITH SURFACE ELASTIC WAVES

This invention relates to a surface elastic wave device for analog to digital conversion with intermediate frequency conversion.

Analog-digital converters with intermediate frequency conversion are known in which the analog signal to be converted is applied to the control input of a voltage controlled oscillator, the output of which is applied, in parallel, to a filter assembly connected to detectors which provide logical signals, the combination of which gives the digital signal corresponding to the initial analog signal.

However, the manufacture of voltage controlled oscillators with surface elastic waves is already known, as described for example in French patent applications Nos. 76/30684, now French patent 2,367,387 76/30685 (U.S. patent applications Ser. Nos. 837,527, filed Sept. 29, 1977, and its continuation 961,487 filed Nov. 17, 1978) and 76/30686, now French Pat. No. 2,290,785, all three having been filed in France on Oct. 7, 1976, in the names of Mr. Pierre, Claude Brossard and Mrs. Jeannine Le Goff, Hênaff.

It is also known to manufacture assemblies of filters in surface elastic wave devices. A description of such filters may be found in the French patent application No. 74/39574, filed Nov. 6, 1974, now French Pat. No. 2,290,785 in the name of Mr. Michel Feldmann, or in the technical article entitled "A.S.W. filter bank using a multistrip reflective array" of Mar. 4, 1976, in the publication "Electronics Letters", Volume 12, No. 5.

One object of this invention is to provide an analog-digital conversion device having a voltage controlled surface elastic wave oscillator and a filter assembly fabricated on a surface elastic wave apparatus in order to obtain an easily reproducible converter, at a low cost Accordingly, a characteristic of this invention is to provide an analog-digital apparatus with intermediate frequency conversion. The apparatus comprises a 4 pole voltage controlled surface elastic wave oscillator and a surface elastic wave filter assembly in which, on the same piezo-electrical substrate, are deposited the transducers of said 4-pole oscillator. A reflector of a surface elastic wave, with track shift, comprises a network of filaments including a receiving sub-network perpendicularly overlapping a supply track aligned with the track defined by the transducers of the 4-pole oscillator. A plurality of transmitting sub-networks overlapping respectively a plurality of return tracks. The sub-networks are all composed of segments of conductive filaments. The segments of the receiving sub-network are respectively connected to the first ends of the segments of the first transmitting sub-network by conductive wires. The second ends of the segments of the first transmitter sub-network are respectively connected to the first ends of the segments of the second transmitting sub-network by conductive wires, and so on, in series up to the first ends of the segments of the last transmitting sub-network. Output transducers overlap, respectively, the return tracks and are connected to classical detectors for producing logical signals, the combination of which produces the digital signal corresponding to the analog signal applied to the input of the voltage controlled 4-pole oscillator.

The characteristics of the above-noted invention and others will become clearer after reading the following description of embodiments, the description being made in relation to the associated drawings, of which:

FIG. 1 is a schematic view of a conversion apparatus according to the present invention, FIG. 2 is a partial schematic view of a variation of the conversion apparatus of FIG. 1, FIG. 3 is a schematic diagram of an example of an arrangement of an output transducer assembly usable in a variation of the conversion device of FIG. 1, and FIG. 4 is a schematic diagram of a variation of the arrangement of FIG. 3.

The analog-digital converter of FIG. 1 is comprised of a surface elastic wave 4-pole oscillator 1, a surface elastic wave filter assembly 2, an output transducer assembly 3 and a detector assembly 4.

The oscillator 1 is a 4-pole oscillator delay line of known type and comprising a substrate 5 which is able to transmit surface elastic waves and a transmitting transducer 6 emitting surface elastic waves to a receiving transducer 7. One of the transducer 6 electrodes is grounded and the other is connected to the signal output of a controllable and variable circuit 8 having a slight delay. One of the transducer 7 electrodes is grounded and the other is connected to the input of an amplifier 9, the output of which is connected to the signal input of circuit 8. The control input of circuit 8 is connected to the converter input terminal 10 to which is applied the analog signal to be converted. The circuit 8 can be of a type which is identical to the one shown in FIG. 6 of French patent application No. 7/30684, previously mentioned above.

In the oscillator 1 transducers 6 and 7 are in the form of interdigited combs whose period λ is related to the average operating frequency Fo of the oscillator by the relationship λ=v/Fo, where v is the travelling speed of the elastic waves on the piezoelectric crystal 5. The principle of operation is as follows. The acoustical waves are propagated at a speed v. If the distance between centers of the transducers 6 and 7 is L, the open loop phase shift for an angular frequency is equal to $$\phi = \frac{\omega L}{v} + \phi_{add}$$

where $\phi$ add is the additional phase shift of the transducers 6 and 7 and the related electronics. To establish operation, the condition must obviously be $\phi = 2K\pi$, which causes the oscillator to operate in a multimode. One can select the length of the transducer 6 to provide a single mode oscillator. In the related electronic components which contribute additional phase shift $\phi$ add, it is obviously necessary to consider the amplifier 9 and the circuit 8, the phase shift of which is variable and dependent on the voltage applied to terminal 10.

Since the oscillator is used in a converter having preferably high gain, the distance L (between transducers 6, 7) should be kept relatively short. The two transducers 6 and 7 are not very selective, to providing tuning within a relatively wide band, of the order of 20 to 30% of the average frequency Fo.

Moreover, the transducer 7 naturally feeds back a portion of the waves received from transducer 7. That is to say feedback occurs when transducer 7 emits at the frequency of oscillator 1 on track 11 which constitutes, in fact, the usable output of oscillator 1.

The surface elastic wave filter assembly is comprised of a supply subnetwork 12 containing equidistant and straight conductive segments which perpendicularly overlap the track 11. Four return sub-networks 13 to 16 respectively contain as many equidistant and straight conductive segments as sub-network 12, and interconnecting conductors such as element 17 for connecting respectively in series the corresponding segments of subnetworks 12 to 16. In practice each group of interconnected segments forms, with the interconnecting conductors, a filament deposited on the substrate 5. The mutual distances of the segments of the networks 12 to 16 are respectively as follows: d12, d13, . . . , d16, each one being different from the other.

As shown in French patent application No. 7/39574 previously noted in the preamble, the networks 13 to 16 respectively send back surface elastic waves on the return tracks 18 to 21, these waves propagating in the direction which is opposite to the direction of the waves of track 11, and having angular frequencies defined by the following equations:

$$\omega 18 = \frac{2\pi V}{d12 + d13}; \omega 19 = \frac{2\pi V}{d12 + d14}; \omega 20 = \frac{2\pi V}{d12 + d15};$$
$$\omega 21 = \frac{2\pi V}{d12 + d16}.$$

Since the distances of the segments vary from one subnetwork to the next, the conductors 17 are oblique.

It appears therefore that if, for example, the analog signal applied to terminal 10 is such that the oscillator 1 operates at the frequency corresponding to 19, only track 19 is transmitting surface elastic waves. Thus, the filter assembly 2 and oscillator 1 provide as shown in the embodiment of FIG. 1 a means for separating 4 levels of the analog signal applied to terminal 10. Of course, the pass band of each transmitting subnetwork must be of a kind to allow this separation effectively. The calculation of this pass band is related to the number of lines of the subnetwork, that is to say, the number of filaments of the assembly 2, and may be determined as indicated in the technical paper entitled "A new multistrip acoustic surface wave filter" which has been presented by the present applicants at the conference "IEEE Ultransonic Symposium", held Nov. 11 to 14, 1974, in Milwaukee, Wisconsin, U.S.A.

The output transducer assembly 3 provides, together with the detector assembly, a means to recognize which one of the 18 to 21 tracks is transmitting acoustical waves and to provide the corresponding digital information.

In the embodiment of FIG. 1, assembly 3 allows the direct obtaining of the above-mentioned digital information in binary code. It is comprised of a single transducer 22 that in practice is not connected as it corresponds to the binary code of the combination 00, a transducer 23 with a grounded electrode and an electrode connected to the first electrode of another transducer 24 having a second electrode which is connected to the input of a detector 25 of the assembly 4, and a transducer 26 which has one electrode grounded and one electrode connected to the first electrode of a last transducer 27 which has its second electrode connected to the input of a detector 28. Transducer 22 is on track 18; transducer 23 on track 19, transducer 26 on track 20, whereas transducers 24 and 27 are both on track 21. Each detector 25 or 28 which can include an amplifier has a respective output 29 and 30 which produces a binary signal "0" or "1", depending on whether a signal is applied or not to its input.

The operation is as follows. When the analog signal applied to terminal 10 operates oscillator 1 at the angular frequency $\omega 18$, the binary signal produced by the combination of outputs 30-29 is 00. When it operates oscillator 1 at the angular frequency of $\omega 19$, the track 19 transmits waves which are partially received by the transducer 23, which transmits a signal at this angular frequency to the first electrode of 24 which by capacitance, transmits the signal to the other electrode 27, then to the input of 25. The binary output assembly 30-29 produces the binary signal 01 when it operates 1 at the angular frequency $\omega 20$. In an analogous manner, the result of the binary output assembly 30-29 produces the binary signal 10. When it operates oscillator 1 at the angular frequency of $\omega 21$, the track 21 transmits waves which are received, at the same time, by transducers 24 and 27, and the binary output assembly 30-29 produces the binary signal 11.

Assuming that the phase shifter 8 decreases the angular frequency of oscillator 1 when the analog signal applied to terminal 10 increases, the output of binary output assembly 30-29 produces the direct binary conversion of the amplitude of the analog signal.

FIG. 2 shows another embodiment of the filter assembly 2 in which subnetworks 13 to 16 and conductors 17 are replaced by a fan-shaped filament assembly 31 which operate as indicated in the article of the review "Electronics Letters" cited in the preamble. The number of levels which can be separated is likewise related to the number of filaments. However, the insertion losses increase once the angle of the fan becomes too open.

The assembly 2 of FIG. 2 can be combined with an output transducer assembly 3 which is identical to the one of FIG. 1, particularly with non adjacent tracks. But as shown in FIG. 2, the return tracks can be adjacent. In the assembly 3 of FIG. 2, transducers 23 and 24 are practically identical to those of FIG. 1, but transducers 26 and 27 are replaced by a single output transucer 32, the fingers of which cover the two last adjacent tracks.

FIG. 3 shows an output transducer assembly 3 capable of distinguishing 16 levels, the binary and decimal values of which are indicated to the right of the Figure. It appears that the arrangement of the transducers is a direct extrapolation of the one in FIG. 2, similar to the one of FIG. 1, thus explaining the simple correspondence with the tables at the right. In practice transducers installed on the same vertical plane can be connected in series, as indicated, or in parallel, or in series-parallel, depending on the impedance level required at the input of the related detector. The transducers must not be exactly matched in order to avoid retransmission of parasitics.

The type of coding carried out with the arrangement of the transducers of FIG. 3 is convenient due to uncertainity as to the transition between separate levels, because one can see simultaneous high level outputs of the associated detectors during a transition from level 7 to level 8.

FIG. 4 shows another arrangement of output transducers which enables an obtaining of a "Gray" code, as indicated on the right side of the Figures, in which there is only one transition per change in level, thus limiting the uncertainty within one level. The binary code can be easily restored if necessary by using the output signals of the detectors and a logical exclusive-OR circuit assembly as shown on page 363 of the work "Principles of Pulse Modulation" by R. W. Cattermole and published by "London Iliffe Books Ltd." in 1969.

In a more general way, it is possible to provide an arbitrary coding by choosing an appropriate arrangement of output transducers. One can therefore, manufacture logarithmic or predistorsion converters.

It should be noted that the acoustic part of the converter which is deposited on the piezo-electric substrate 5 can be manufactured very economically and that the rest of the converter is composed of low-priced components which can be integrated into microelectronics. Furthermore, eventual temperature caused drifting is completely compensated when the substrate has a uniform temperature.

As a numerical example, it is known to manufacture a surface elastic wave oscillator operating at 200 MHz and which enables an operating frequency in a band of 50 MHz, fully 25% of the nominal frequency. If a converter capable of distinguishing among 128 levels is desired, it is necessary therefore to provide an arrangement of 400 KHz per level. This type of selectivity is obtained with the number of conductive filaments of the order of 500 within the filter assembly 2. The access time of the converter is given by the indeterminate relation caused by the filter selectivity, i.e. $1/(400 \text{ KHz}) = 2.5 \mu s$. Therefore present technology provides a way to obtain a numerical signal having 7 binary elements, corresponding to 128 levels, with an acquisition time of a few microseconds.

More generally for a number of levels N and a tuning band related to the oscillator of B, the access time is:

$$\tau = \frac{N}{F_o B}.$$

The number of filaments of the assembly 2 is:

$$N_t = \frac{N}{B}.$$

In practice, lithium niobate crystal is the preferred choice for the substrate 5, its value B is of the order of 0.2 to 0.3. The central frequency Fo can reach 800 MHz and the number of filaments is actually limited to a few thousands. The ultimate actual performance is set, being less than 1000 and $N/\tau$ less than $250 \times 10^6$ and with a 4-bit binary signal the minimum access time is 60 ns.

When the converter basic parameter is the acquisition time, with a reduced number of levels it is necessary to take into consideration, in the arrangement, the output transducer layout. By referring again to FIG. 1, one can concentrate the transducers in a short distance, corresponding to a negligible propagation time.

It may also be seen that between the various vertical lines on which transducers are deposited, FIG. 3 is a distance corresponding to a time lapse T between the binary elements outputted by the detector, which will enable the direct provision of a serial type binary number ready for transmission.

The embodiments of the invention in which an exclusive property or privilege is claimed are defined as follows:

1. An analog-to-digital converter with intermediate frequency conversion, said converter comprising a 4-pole voltage controlled oscillator means and a filter means, both said oscillator means and said filter using an elastic surface wave piezoelectric substrate device wherein the improvement comprises emitter transducer means disposed on said substrate to launch surface waves along a forward track, said filter means being made of reflector means comprised of a network of spaced conductive filaments forming a receiving sub-network overlapping said forward track, a plurality of serially connected transmitting sub-network overlapping a corresponding plurality of backward tracks, the spacing between said conductive filaments of the network series increasing from a transmitting sub-network to the next of the sub-networks, and interconnection portions between said sub-networks, output transducer means overlapping said return tracks, and detector means responsive to said output transducer means for producing a combination of digital signals corresponding to an analog signal applied to a voltage controlled input of said 4-pole oscillator.

2. Apparatus according to claim 1, wherein the segments of the transmitting sub-networks are respectively perpendicular to the return tracks, the conducting wires connected thereto being oblique and oriented in a fan shape.

3. Apparatus according to claim 1, wherein the segments of the transmitting sub-networks and the conducting wires connected thereto are aligned to form a unique fan shape.

4. Apparatus according to one of claims 1, 2 or 3, wherein the output transducers are grouped according to standard track lines, the transducers overlapping different return tracks and said return tracks are overlapped by more than one output transducer, each standard line comprising a detector connected to the transducers of that line and producing a binary element, the group of the binary elements produced by the detectors forming a digital code corresponding to the analog signal applied to the surface elastic wave oscillator.

5. Apparatus according to claim 4, wherein the said standard lines are spaced by a distance corresponding to a wave propagation time equal to the time lapse between two binary units, the output signals of the detectors being transmitted in series.

6. Apparatus according to claim 4, wherein each output transducer corresponds to a binary "1" in the table of pure binary numbers.

7. Apparatus according to claim 4, wherein each output transducer corresponds to a binary "1" in the table of the binary numbers transposed in Gray code.

8. Apparatus according to claim 5, wherein each output transducer corresponds to a binary "1" in the table of pure binary numbers.

9. Apparatus according to claim 5, wherein each output transducer corresponds to a binary "1" in the table of the binary numbers transposed in Gray code.

* * * * *